(12) United States Patent
Tsai et al.

(10) Patent No.: US 11,075,131 B2
(45) Date of Patent: Jul. 27, 2021

(54) SEMICONDUCTOR PACKAGE AND METHOD OF FORMING THE SAME

(71) Applicant: Taiwan Semiconductor Manufacturing Co., Ltd., Hsinchu (TW)

(72) Inventors: Yi-Da Tsai, Chiayi Country (TW); Ching-Hua Hsieh, Hsinchu (TW); Chih-Wei Lin, Hsinchu County (TW); Tsai-Tsung Tsai, Taoyuan County (TW); Sheng-Chieh Yang, Hsinchu (TW); Chia-Min Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/547,579

(22) Filed: Aug. 22, 2019

(65) Prior Publication Data

US 2021/0057298 A1  Feb. 25, 2021

(51) Int. Cl.
*H01L 23/29* (2006.01)
*H01L 21/56* (2006.01)
*H01L 21/3105* (2006.01)
*H01L 23/532* (2006.01)

(52) U.S. Cl.
CPC ...... *H01L 23/295* (2013.01); *H01L 21/31053* (2013.01); *H01L 21/565* (2013.01); *H01L 23/5329* (2013.01)

(58) Field of Classification Search
CPC ............ H01L 23/295; H01L 21/565; H01L 21/31053; H01L 23/5329; H01L 2224/18; H01L 25/0655; H01L 2924/15311
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |

(Continued)

*Primary Examiner* — Jasmine J Clark
(74) *Attorney, Agent, or Firm* — JCIPRNET

(57) ABSTRACT

A semiconductor package including a semiconductor die, a molding compound and a redistribution structure is provided. The molding compound laterally wraps around the semiconductor die, wherein the molding compound includes a base material and a first filler particle and a second filler particle embedded in the base material. The first filler particle has a first recess located in a top surface of the first filler particle, and the second filler particle has at least one hollow void therein. The redistribution structure is disposed on the semiconductor die and the molding compound, wherein the redistribution structure has a polymer dielectric layer. The polymer dielectric layer includes a body portion and a first protruding portion protruding from the body portion, wherein the body portion is in contact with the base material and the top surface of the first filler particle, and the first protruding portion fits with the first recess of the first filler particle.

20 Claims, 14 Drawing Sheets

(56) References Cited

U.S. PATENT DOCUMENTS

| | | | |
|---|---|---|---|
| 9,496,189 B2 | 11/2016 | Yu et al. | |
| 2012/0161621 A1* | 6/2012 | Sato | H01L 33/56 |
| | | | 313/512 |
| 2015/0001559 A1* | 1/2015 | Sasaoka | H01L 33/62 |
| | | | 257/88 |
| 2019/0148340 A1* | 5/2019 | Yu | H01L 24/19 |
| | | | 257/737 |
| 2019/0304916 A1* | 10/2019 | Reichman | H01L 24/20 |

* cited by examiner

SEMICONDUCTOR PACKAGE AND METHOD OF FORMING THE SAME

BACKGROUND

The semiconductor industry has experienced rapid growth due to continuous improvements in the integration density of various electronic components (i.e., transistors, diodes, resistors, capacitors, etc.). Semiconductor devices and integrated circuits are typically manufactured on a single semiconductor wafer. The dies of the wafer may be processed and packaged with other semiconductor devices or dies at the wafer level, and various technologies have been developed for the wafer level packaging. Currently, integrated fan-out packages are becoming increasingly popular for their compactness. The improved routing capability and reliability provided by the integrated fan-out packages are key factors for future packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
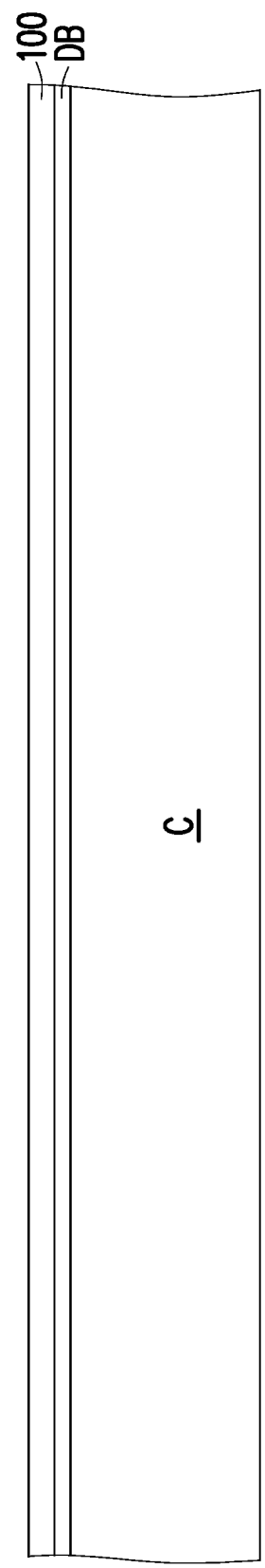
FIG. 1 to FIG. 9 are schematic cross-sectional views illustrating a manufacturing process of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 9 are schematic cross-sectional views illustrating a manufacturing process of a semiconductor package in accordance with some embodiments of the disclosure. In exemplary embodiments, the manufacturing method is part of a wafer level packaging process. In some embodiments, one die is shown to represent plural dies of the wafer, and one semiconductor package is shown to represent plural semiconductor packages obtained following the manufacturing method.

Referring to FIG. 1, in some embodiments, a carrier C with a buffer layer 100 coated thereon is provided. In some embodiment, the carrier C may be a glass carrier or any suitable carrier for carrying a semiconductor wafer for the manufacturing method of the semiconductor package. In some embodiments, the buffer layer 100 is disposed over the carrier C. In some embodiments, the buffer layer 100 may be a dielectric material layer. In some embodiments, the buffer layer 100 may be a polymer layer which is made of polyimide, polybenzoxazole (PBO), benzocyclobutene (BCB), or any other suitable polymer-based dielectric material. In some embodiments, the buffer layer 100 may be Ajinomoto Buildup Film (ABF), Solder Resist film (SR), or the like. The top surface of the buffer layer 100 may be levelled and may have a high degree of coplanarity.

In some embodiments, a debond layer DB is formed between the carrier C and the buffer layer 100. In some embodiments, the debond layer DB is disposed on the carrier C, and the material of the debond layer DB may be any material suitable for bonding and debonding the carrier C from the above layer(s) (e.g. the buffer layer 100) or any wafer(s) disposed thereon. In some embodiments, the debond layer DB may include a release layer (such as a light-to-heat conversion ("LTHC") layer) or an adhesive layer (such as a ultra-violet curable adhesive or a heat curable adhesive layer).

Figure 2:
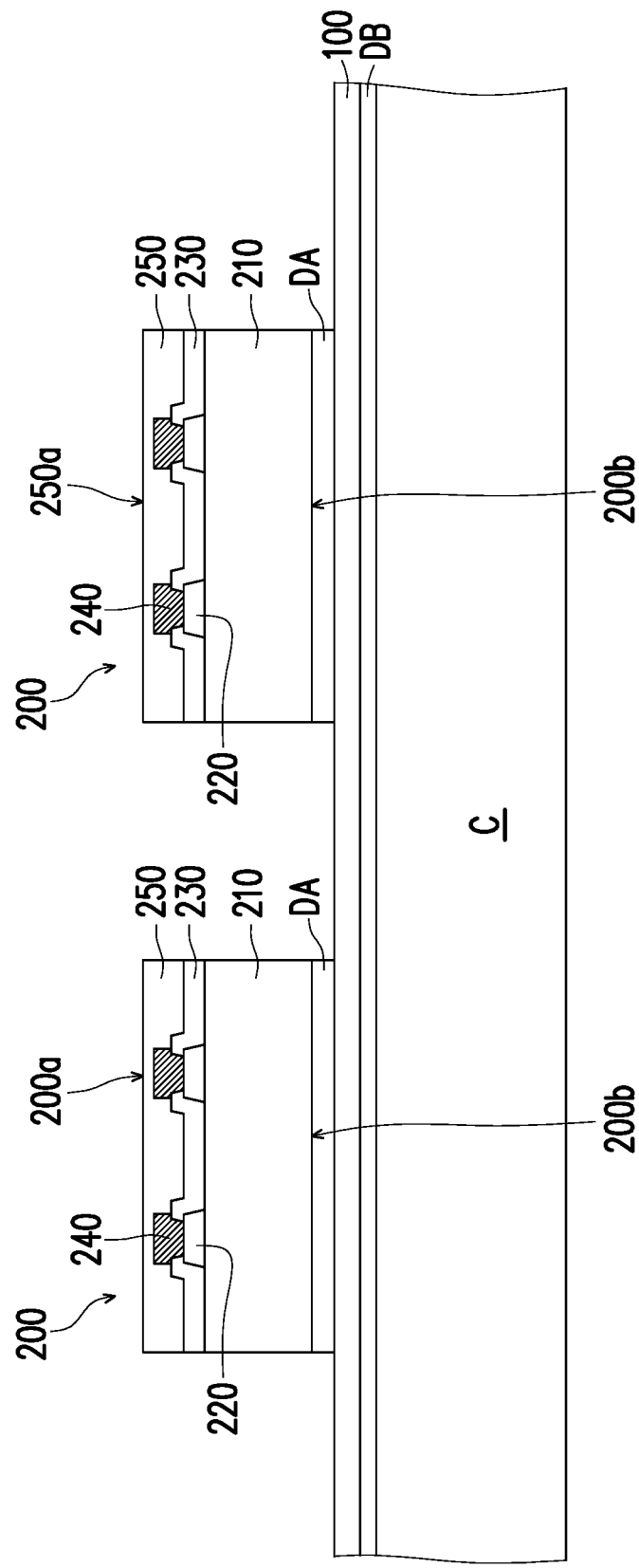

Referring to FIG. 2, in some embodiments, semiconductor dies 200 are provided over the carrier C. In some embodiments, in FIG. 2, two semiconductor dies 200 are shown, but the number of the semiconductor dies 200 is not limited to be two but can be more than two. In some embodiments, the semiconductor dies 200 may have the same function or different functions.

The semiconductor dies 200, for example, each include a semiconductor substrate 210, a plurality of conductive pads 220, a passivation layer 230, a plurality of conductive pillars 240, and a protection layer 250. In some embodiments, the conductive pads 220 are disposed over the semiconductor substrate 210. The passivation layer 230 is formed over the semiconductor substrate 210 and has contact openings that partially expose the conductive pads 220. The conductive pillars 240 are formed on the conductive pads 220. In addition, the protection layer 250 is formed on the passivation layer 230 to cover the conductive pillars 240. In some embodiments, the protection layer 250 has a sufficient thickness to encapsulate and fully cover the conductive pillars 240. In some embodiments, the conductive pillars 240 may be exposed from the protection layer 250. In some embodiments, the protection layer 250 may be optional and the conductive pillars 240 are exposed.

In some embodiments, the semiconductor substrate 210 may be a silicon substrate including active components (e.g., transistors or the like) and/or passive components (e.g., resistors, capacitors, inductors, or the like) formed therein. The conductive pads 220 may be aluminum pads, copper pads, or other suitable metallic pads. In some embodiments, the passivation layer 230 and/or the protection layer 250 may be a polybenzoxazole (PBO) layer, a polyimide (PI) layer or other suitable polymers. In some alternative embodiments, the passivation layer 230 and/or the protection layer 250 may be made of inorganic materials, such as silicon oxide, silicon nitride, silicon oxynitride, or any suitable dielectric material. In some embodiments, the materials of the passivation layer 230 and/or the protection layer 250 may be the same. In some embodiments, the materials of the passivation layer 230 and/or the protection layer 250 may be different.

As shown in FIG. 2, the semiconductor die 200 has a front surface (active surface) 200a and a rear surface 200b opposite to the front surface 200a. In some embodiments, the rear surface 200b of the semiconductor die 200 is attached (or adhered) to the buffer layer 100 through a die attach film DA, while the front surface 200a of the semiconductor die 200 faces up and is exposed. In some embodiments, when the protection layer 250 fully covers the semiconductor die 200, the conductive pillars 240 are not exposed but the top surface 250a of the protection layer 250 facing upward is exposed. In certain embodiments, the die attach film DA is first disposed on the rear surface 200b of the semiconductor die 200, then the semiconductor die 200 is attached to the buffer layer 100 by placing the die attach film DA between the semiconductor die 200 and the buffer layer 100. Alternatively, the die attach film DA is firstly applied on the buffer layer 100 and then the semiconductor die 200 is mounted on the die attach film DA. With the die attach film DA, a better adhesion between the semiconductor die 200 and the buffer layer 100 is ensured.

It is noted that, the semiconductor die 200 described herein may be referred as a semiconductor chip or an integrated circuit (IC). In an alternative embodiment, the semiconductor die 200 described herein may include one or more semiconductor devices. In certain embodiments, the semiconductor die 200 may include one or more digital chips, analog chips or mixed signal chips, such as application-specific integrated circuit ("ASIC") chips, sensor chips, wireless and radio frequency (RF) chips, memory chips, logic chips or voltage regulator chips. In some embodiments, the semiconductor dies 200 may include the same types of chips. In some embodiments, the semiconductor dies 200 may include different types of chips.

FIG. 3A through FIG. 6B are schematic cross-sectional views showing the intermediate structure at various stages during the fabrication of a semiconductor package in accordance with some embodiments. FIGS. 3B, 4B, 5B and 6B show schematic enlarged views of a region R in FIGS. 3A, 4A, 5A and 6A, and FIG. 4C shows a schematic top view of FIG. 4B.

Figure 3A:
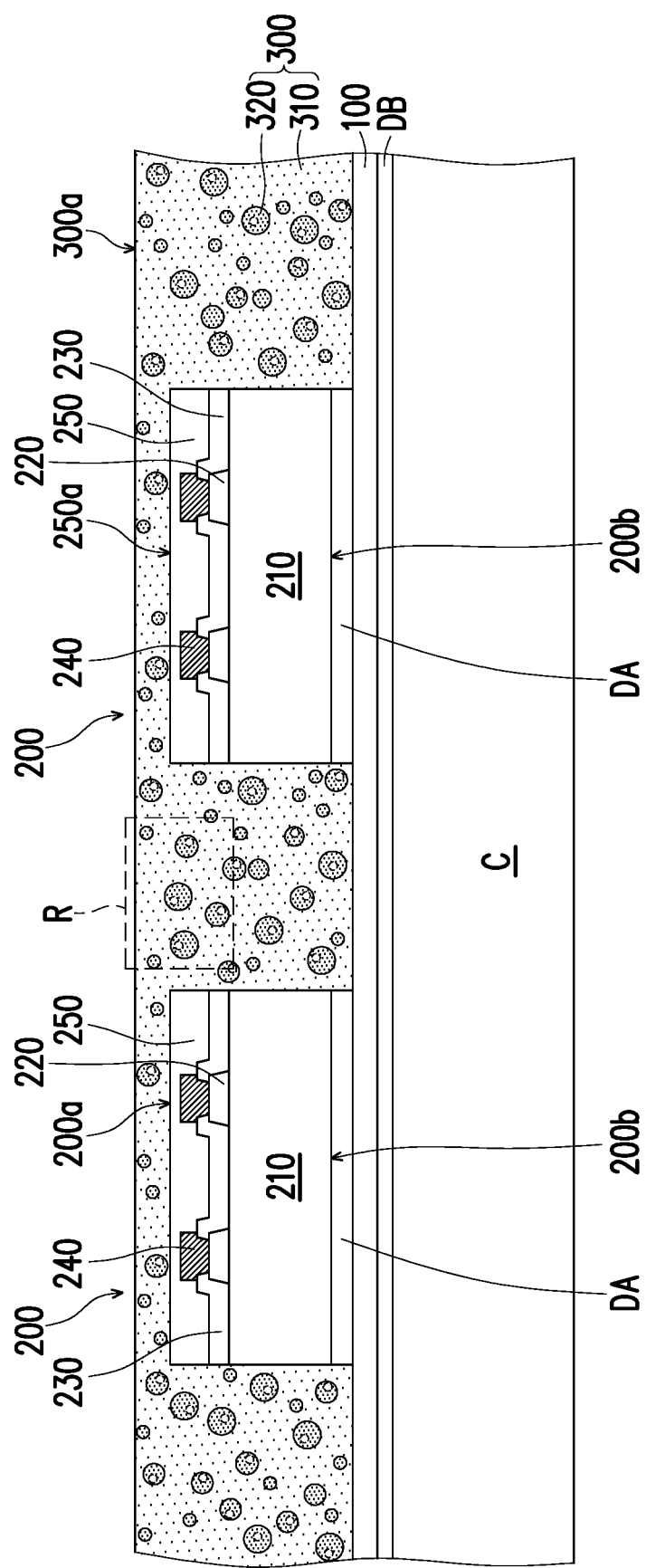
Figure 3B:
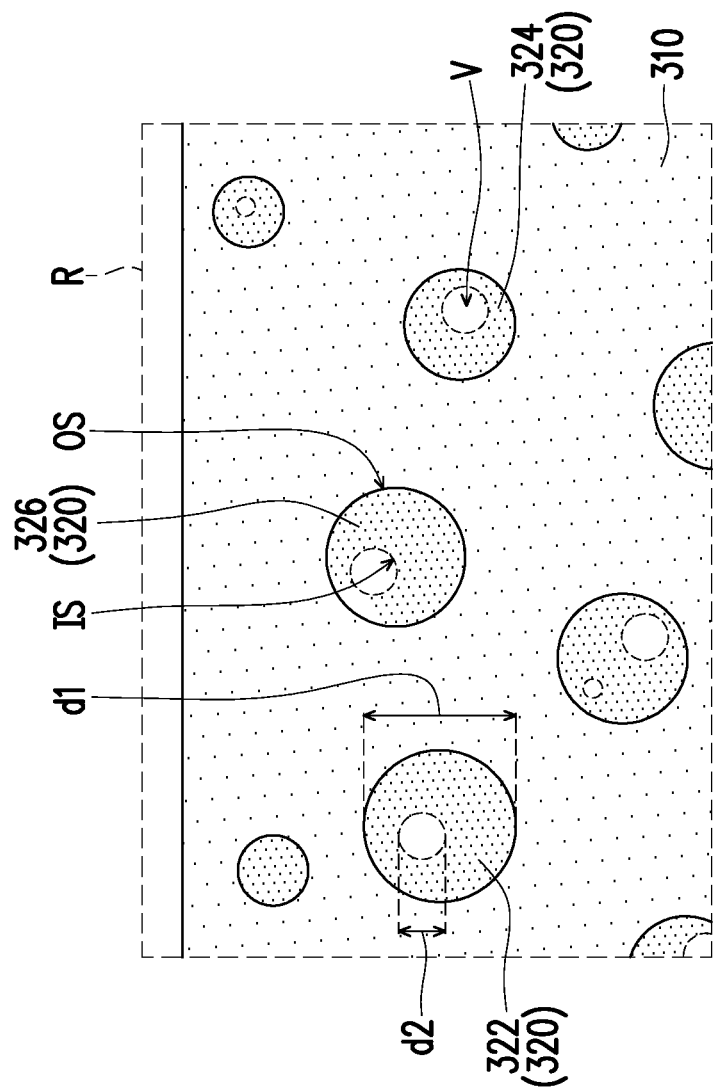

Referring to FIG. 3A and FIG. 3B, in some embodiments, a molding compound 300 is formed over the carrier C and the semiconductor dies 200. In some embodiments, the molding compound 300 fills the space between the semiconductor dies 200 and covers the buffer layer 100. In one embodiment, the molding compound 300 may be formed by the over-molding process and the molding compound 300 is cured at a temperature ranging from about 120 Celsius degree to about 150 Celsius degree, for example. In some embodiments, the formed molding compound 300 covers the entirety of the semiconductor dies 200 and encapsulates the semiconductor dies 200. That is, a top surface 300a of the molding compound 300 is higher than the front surfaces 200a of the semiconductor dies 200. In some embodiments, the molding compound 300 is formed from a molding material containing a hardening agent with amine groups. In some embodiments, the Young's modulus of the molding compound 300 may be equal to or larger than 15 GPa.

In some embodiments, the molding compound 300 includes a base material 310 and filler particles 320 distributed in the base material 310. In some embodiments, the material of the base material 310 includes epoxy resins, phenolic resins or silicon-containing resins, or the like, and the material of the filler particles 320 includes silica, alumina, zinc oxide, titanium dioxide, or the like. In some embodiments, the filler particles 320 may be sphere-shaped or globular, and a sphericity of the filler particles 320 ranges from about 0.3 to about 1. In some embodiments, the content of the filler particles 320 in the total of the molding compound 300 ranges from about 70% by weight (wt %) to about 90% by weight (wt %) or about 80 wt %-85 wt %. In one embodiment, the content of the filler particles 320 in the total of the molding compound 300 is about 82 wt %. In certain embodiments, the filler particles 320 may have a cut size of about 10-15 microns. In some embodiments, the filler particles 320 may have an average size (diameter) of about 3-8 microns.

In some embodiments, the filler particles 320 are predominantly particles with hollow voids or cavities therein. As shown in FIG. 3A and FIG. 3B, some of the filler particles 320 may each have one or more hollow voids V therein. In other words, when considering some of the filler particles are round spheres, the filler particles 320 may each have an outer surface OS and one or more inner surfaces IS due to the existence of the hollow voids V. As shown in FIG. 3B, the filler particles 320 are contained and enclosed within the base material 310 of the molding compound 300, so that the outer surface OS of the filler particle 320 is in contact with the base material 310 and the one or more inner surfaces IS defining the one or more hollow voids V are enclosed within the particles and are not exposed. In one embodiment, the filler particles 320 may have a size d1 of about 10 μm to about 15 μm, and the one or more hollow voids V may have a size d2 of about 5 μm to about 13 μm. In one embodiment, the filler particles 320 may have a size d1 of about 12 μm, and the one or more hollow voids V may have a size d2 of about 5 μm or less.

In one embodiment, an average ratio of a volume of the hollow void(s) V to a volume of the filler particle 320 thereof may be equal to or less than about 30% by volume or may be equal to or less than about 20% by volume. It is understood that some of the filler particles 320 may be solid particles without hollow voids therein.

For illustration purposes, certain filler particles of the filler particles 320 are labelled individually. In FIGS. 3B, 4B, 4C, 5B and 6B, filler particle 322, filler particle 324, filler particle 326 and filler particle 328 are shown.

Figure 4A:
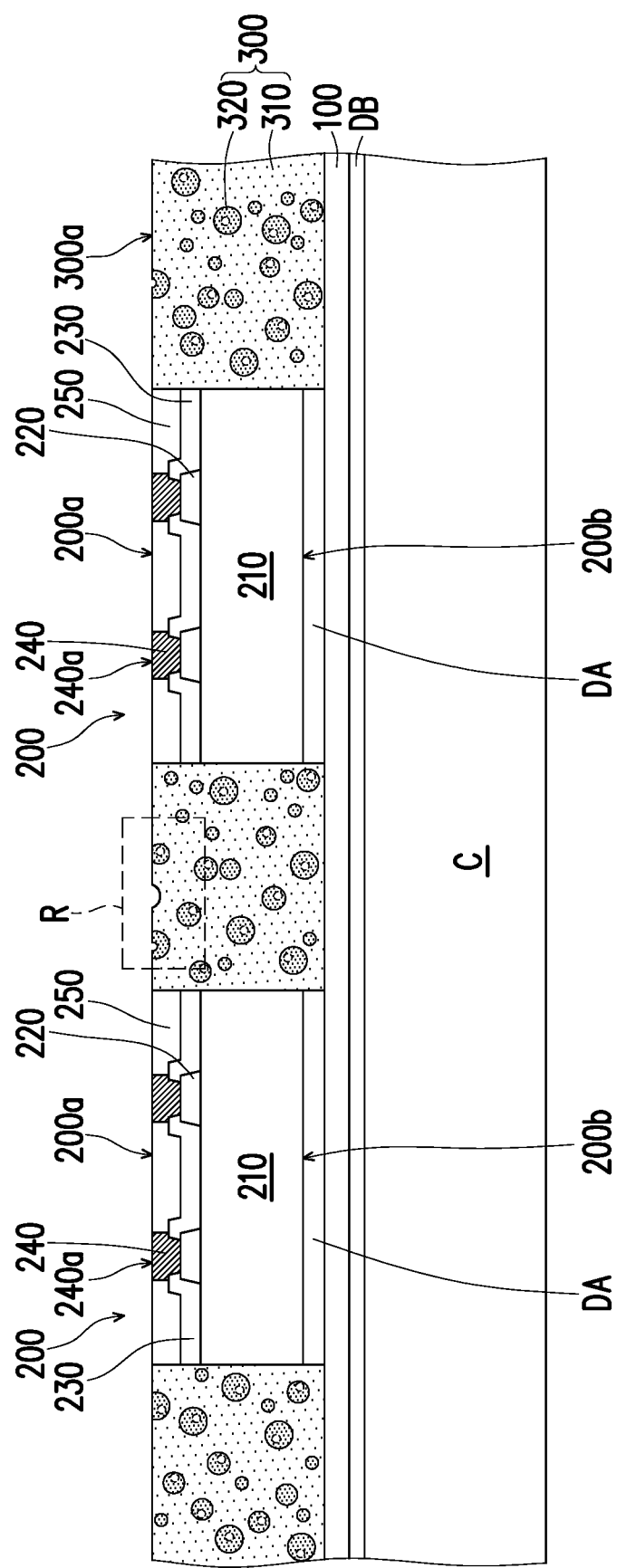
Figure 4B:
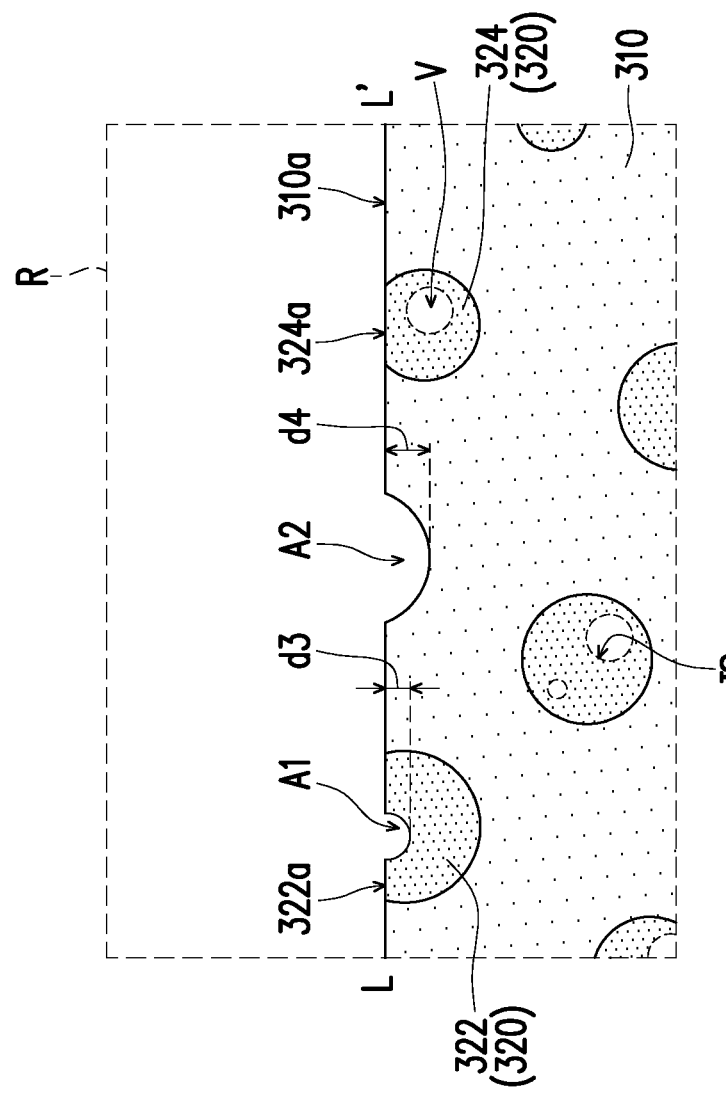
Figure 4C:
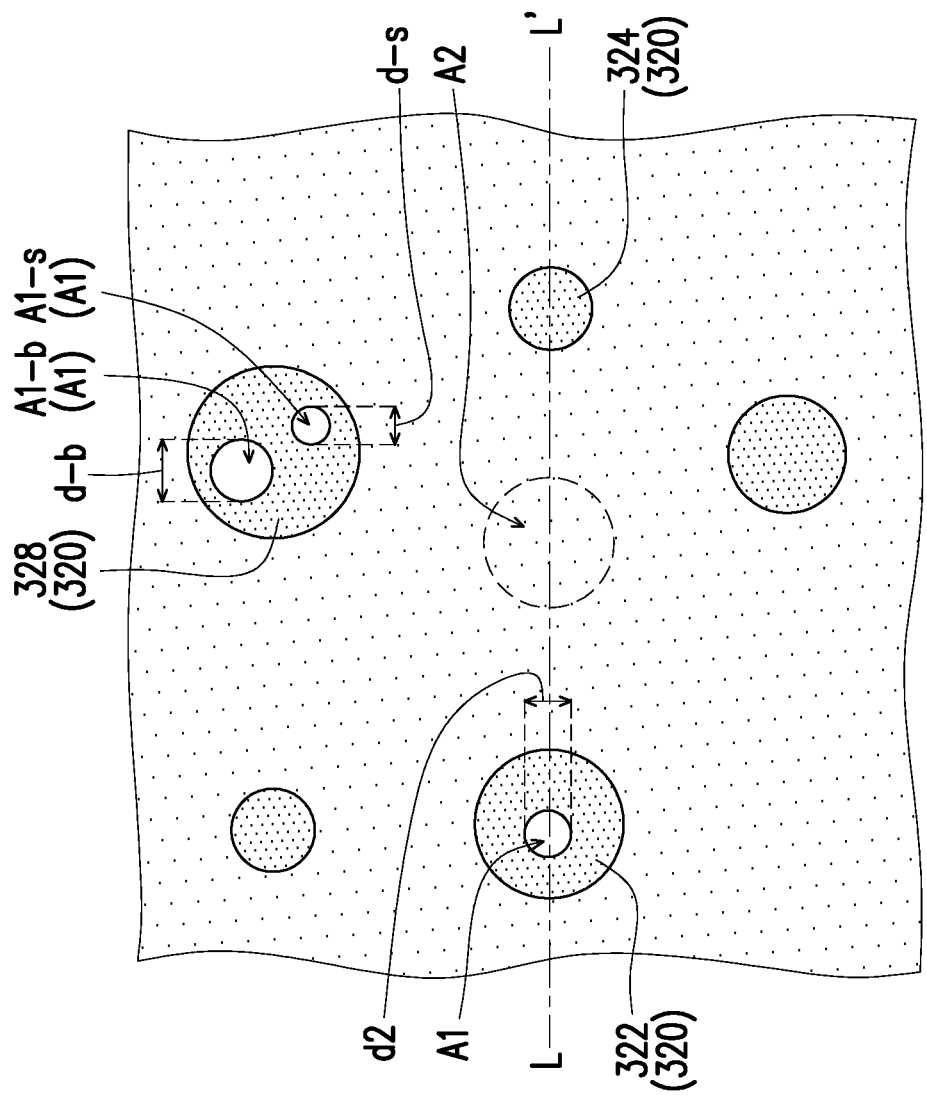

Referring to FIG. 4A, FIG. 4B and FIG. 4C, in some embodiments, a planarization process is performed to remove portions of the over-molded molding compound 300 and the protection layers 250 of the semiconductor dies 200 until top surfaces 240a of the conductive pillars 240 are exposed. In some embodiments, the planarization process includes performing a mechanical grinding process, a chemical mechanical polishing (CMP) process or the combination thereof. After the polishing or grinding step, a cleaning step may be optionally performed to clean and remove the residues generated from the grinding or polishing step. However, the disclosure is not limited thereto, and the planarization process may be performed through any other suitable method. In some embodiments, portions of the conductive pillars 240 may also be slightly polished or grinded to ensure the exposure of all the conductive pillars 240.

As shown in FIG. 4A, the planarized molding compound 300 laterally encloses the semiconductor dies 200. In some embodiments, the semiconductor dies 200 are embedded in the molding compound 300, but the front surfaces 200a of the semiconductor dies 200 are not covered by the planarized molding compound 300. In some embodiments, through the planarization, the front surfaces 200a of the semiconductor dies 200 become substantially levelled with the top surface 300a of the planarized molding compound 300. In other words, the front surfaces 200a of the semiconductor dies 200 are coplanar with the top surface 300a of the planarized molding compound 300. In some embodiments, after the planarization process, the top surface 300a is relative flat and smooth and the roughness of the top surface 300a of the planarized molding compound 300 is satisfactorily small. For example, the roughness of the top surface 300a of the planarized molding compound 300 is about 0.2 µm, or even less than 0.2 µm.

FIG. 4C show a top view from the FIG. 4B, where FIG. 4B is a cross-sectional view along the line L-L' of the FIG. 4C. As shown in FIGS. 4B and 4C, in some embodiments, after the planarization process, one or more recesses A1 and/or pits A2 may be formed in the planarized molding compound 300. In detail, due to the planarization process, some filler particles 320 in an upper portion of the base material 310 may be removed (polished or grinded) partially, causing some of the filler particles 320 to have the top portions removed, and bottom portions remained in the base material 310. For example, as shown in FIG. 4B, the top portions of the original filler particles 322 and 324 are removed, and the bottom portions of the original filler particle 322 and 324 remain inlaid in the base material 310. The resulting planarized filler particles 322 and 324 will thus have top surfaces 322a and 324a to be planar, which planar top surfaces 322a and 324a are substantially coplanar with a top surface 310a of the planarized base material 310. In some embodiments, the hollow voids V of some planarized filler particles 320 may be opened and portions of the one or more inner surfaces IS may be exposed, so as to form one or more recesses A1 in the planarized filler particles 320. In FIG. 4B, after planarization, the hollow void V of the planarized filler particle 322 is opened, so as to form the recess A1 located in the top surface 322a of the planarized filler particle 322. In FIG. 4C, two recesses A1 are formed in the planarized filler particle 328 by opening two hollow voids V within the filler particle 328 during planarization process. However, the number of recesses A1 shown in the figures is merely exemplary and is not limited thereto.

In some embodiments, some of the hollow voids V of the planarized filler particles 320 may not be opened, and thus no recess is formed in the particle(s). For example, as shown in FIG. 4B, the hollow void V of the filler particle 324 is not opened by planarization, and there is no recess located in the top surface 324a of the filler particle 324.

In some embodiments, the filler particles 320 may be removed or pulled from the base material 310 during the planarization, so as to form one or more pits A2 in the base material 310 of the planarized molding compound 300. For example, when more and more of the whole grain of the filler particle(s) (e.g. more than half or two-third of the whole grain of the filler particle(s)) is removed during planarization, the adhesion between the remaining portion of the filler particle(s) and the base material 310 becomes weaker and weaker and finally the filler particle(s) 320 is pulled up from the based material 310, so that one or more pits A2 are formed in the base material 310 of the planarized molding compound 300. Referring to FIG. 3B and FIG. 4B, the pit A2 is formed in the base material 310 of the planarized molding compound 300 by performing the planarization process to remove the filler particle 326 from the base material 310. That is, since the pit(s) A2 may be formed from the release of the filler particle(s) 320, the recess depth of the formed pits A2 is smaller than the original particle size of the filler particle(s) 320 but the size (diameter from the top view) of the formed pits A2 may be equivalent to or smaller than the original particle size of the filler particle(s) 320.

In some embodiments, as shown in FIG. 4B, a recess depth d3 of the recesses A1 from the top surface 322a of the planarized filler particle 322 (substantially levelled with the top surface 310a of the base material 310) may be less than the size d2 of the hollow voids V, and a recess depth d4 of the pits A2 from the top surface 310a of the base material 310 may be equal to or less than half of the size d1 of the filler particles 320. In some embodiments, the depth d3 of the recess A1 from the top surface 310a of the base material 310 is, for example, ranges from about 0.1 µm to about 2.5 µm. In some embodiments, the depth d3 of the recess A1 from the top surface 310a of the base material 310 is equivalent to or less than 3 µm. In some embodiments, the depth d3 of the recesses A1 from the top surface 310a of the base material 310 is less than 10 µm. In some embodiments, the depth d4 of the pit A2 from the top surface 310a of the base material 310 is, for example, ranges from about 0.01 µm to about 4.5 µm. In some embodiments, the depth d4 of the pit A2 from the top surface 310a of the base material 310 is, for example, equivalent to or less than about 50 µm. In some embodiments, the depth d4 of the pits A2 from the top surface 310a of the base material 310 is, for example, less than about 7 µm.

Referring to FIG. 4C, the filler particle 328 is shown to have two recesses A1-s and A1-b formed therein and the two recesses A1-s and A1-b of the filler particle 328 are shown to have different sizes (diameters d-s and d-b from the top view). In some embodiments, the two recesses A1-s and A1-b of the filler particle 328 may have different recess depths from the top surface 310a of the base material 310. In some embodiments, the two recesses A1-s and A1-b of the filler particle 328 may have the same recess depth from the top surface 310a of the base material 310. For example, the recess A1 of the filler particle 322 in FIG. 4C is shown to have a size d2 equivalent to the size d2 of the void (as shown in FIG. 3B) when the recess depth d3 is about half of the size d2.

In some embodiments, the material of the base material 310 of the molding compound 300 is chosen to have a Young's modulus equivalent to or higher than 15 GPa to better hold the filler particles in/inside the base material 310 and to ensure less or minimum dropping or falling of the filler particles during the planarization process. By doing so, less or minimum pits are formed, and only smaller recesses of the filler particles are formed after planarization, thus providing a more flat and smooth surface for the later-formed layers or patterns.

Herein, based on the descriptions directed to the corresponding figures, the pits are formed from the removal or release of the whole filler particles, while the recesses are formed by partially removing the filler particles to expose the inner void(s). However, it is understood recesses and pits may be used interchangeably and these terms are not intended to limit the shapes or configurations of the depressed portions or regions.

Uneven surface of the molding compound may cause distortion of the subsequently formed overlying redistribution layer(s), leading to defects of the redistribution layer such as line-bridging or broken-lines. According to the embodiments of the invention, shallower and smaller recesses/pits are formed after planarization, so that an evener and flatter surface of the molding compound may be achieved, which is beneficial for the subsequently formed fine-pitch redistribution structure. In some embodiments, a line width or a pitch of the lowermost redistribution layer of the fine-pitch redistribution structure is equal to or less than about 10 µm. In one embodiment, the line width or the pitch of the lowermost redistribution layer of the fine-pitch redistribution structure is about 2 µm.

After forming the planarized molding compound 300, a redistribution structure 400 (shown in FIG. 7) is then formed on the semiconductor dies 200 and planarized molding compound 300. In some embodiments, the redistribution structure 400 includes a plurality of polymer dielectric layers 410, 430, 450 and 470 and a plurality of redistribution layers 420, 440, 460 and 480 stacked alternately. The number of the polymer dielectric layers or the redistribution layers is not limited by the disclosure. The redistribution structure 400 is electrically connected to connectors underneath. Here, the afore-said connectors may be the conductive pillars 240 of the semiconductor dies 200. The fabrication of the redistribution structure 400 is described in accompany with FIG. 5A through 7 in detail.

Figure 5A:
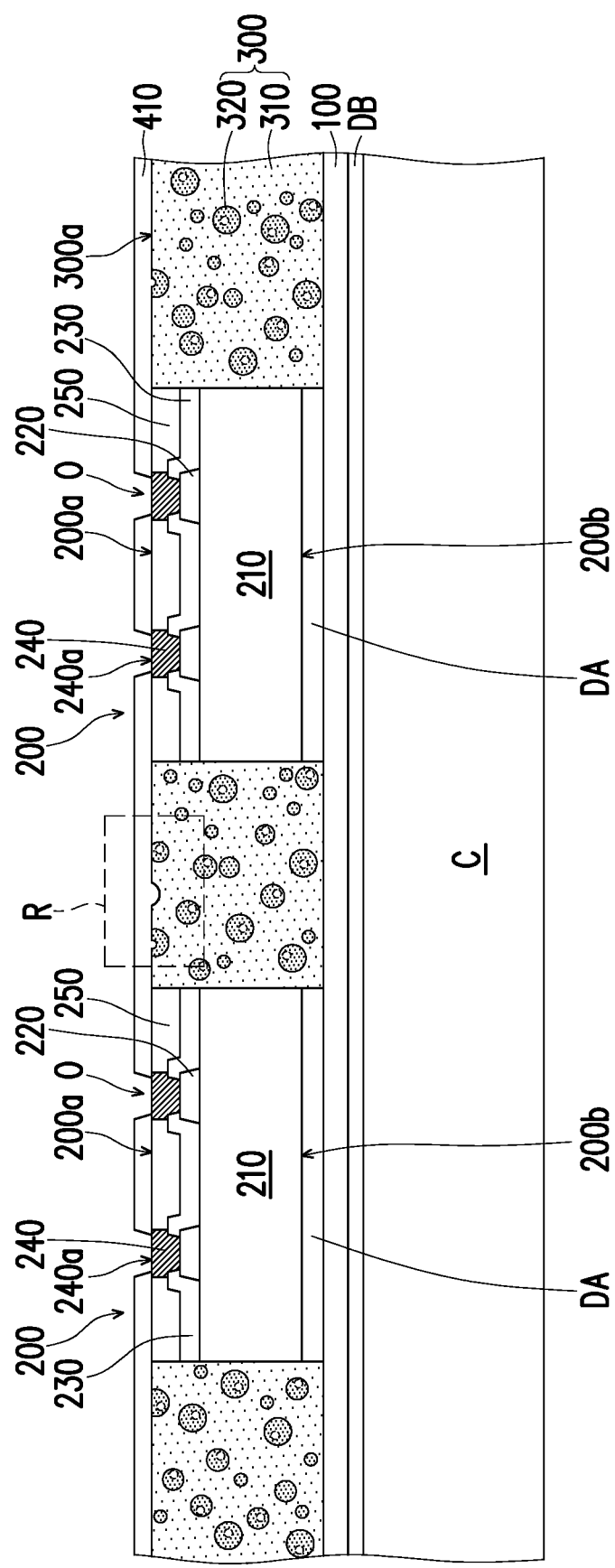
Figure 5B:
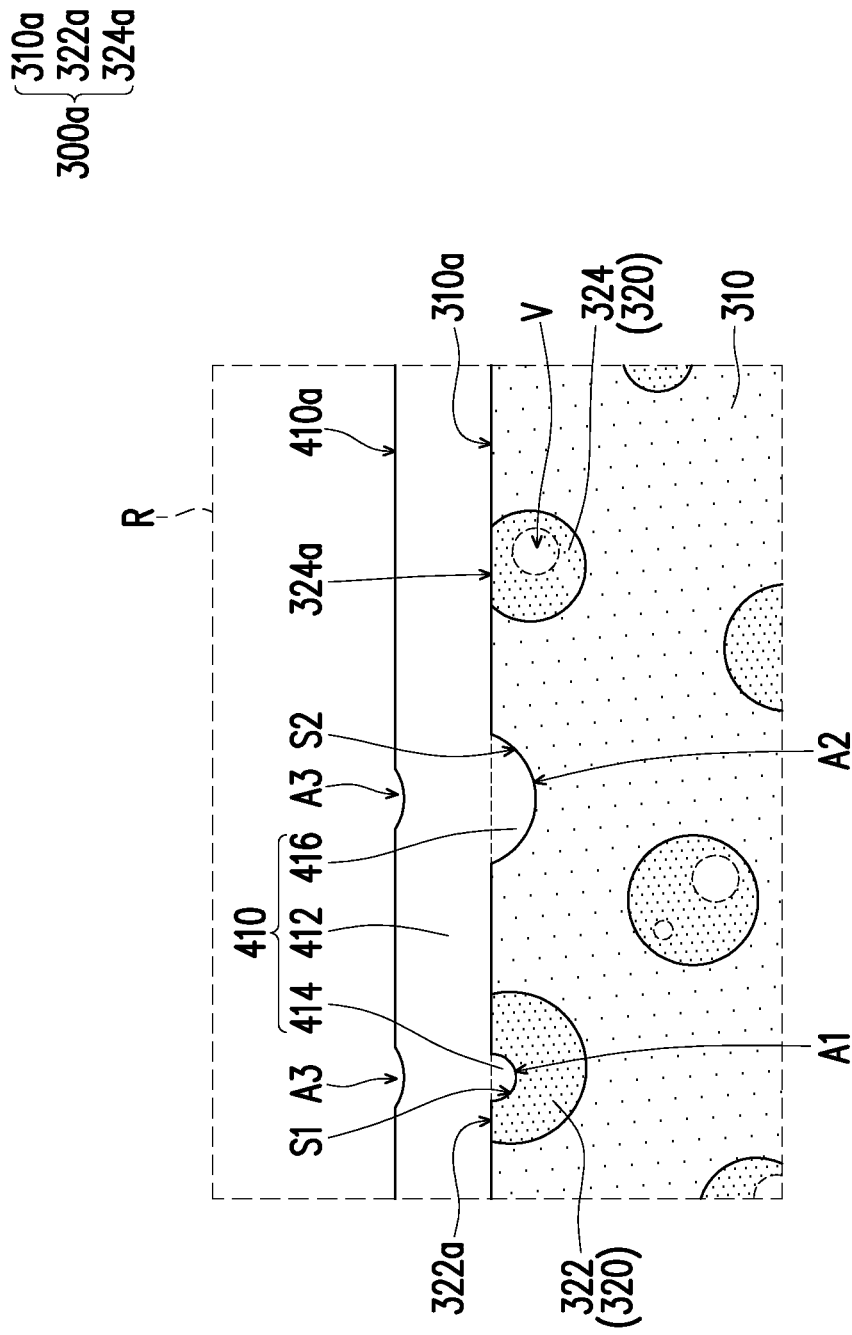

Referring to FIGS. 5A and 5B, in some embodiments, the polymer dielectric layer 410 is formed on the semiconductor dies 200 and molding compound 300. The polymer dielectric layer 410 includes a plurality of via openings O for exposing portions of the conductive pillars 240.

As shown in FIG. 5B, the polymer dielectric layer 410 is formed directly on the planarized surface 300a of the molding compound 300 and in contact with the molding compound 300. The polymer dielectric layer 410 covers the top surface 310a of the base material 310 and fills up the one or more pits A2 in the molding compound 300 as well as covers the top surfaces 322a and 324a of the filler particles 322 and 324 and fills up the one or more recesses A1 of the filler particles 320 of the molding compound 300. In detail, the polymer dielectric layer 410 includes a body portion 412 over the molding compound 300, and one or more first protruding portions 414 and second protruding portions 416 protruding from the body portion 412 into the recesses A1 and the pits A2. In some embodiments, the body portion 412 is in contact with the base material 310 and filler particles 322 and 324, the one or more first protruding portions 414 fill and fit with the one or more recesses A1, and the one or more second protruding portions 416 fill and fit with the one or more pits A2. In other words, the interface S1 between the first protruding portion 414 and the recess A1 is located between the filler particle 320 and the polymer dielectric layer 410, while the interface S2 between the second protruding portion 416 and the pit A2 is located between the base material 310 and the polymer dielectric layer 410. In certain embodiments, outer contours of the one or more first protruding portions 414 match the one or more recesses A1, and outer contours of one or more second protruding portions 416 match the one or more pits A2.

In some embodiments, after forming the polymer dielectric layer 410, one or more shallow recesses A3 are formed in the top surface 410a of the polymer dielectric layer 410 at positions over the recesses A1 and/or pits A2. In some alternative embodiments, the polymer dielectric layer 410 may be formed with a planar top surface without recesses.

In some alternative embodiments, before forming the polymer dielectric layer 410, a dielectric pre-layer may be formed to fill into the one or more recesses A1 and the one or more pits A2 for better planarization degree by depositing a dielectric material over the molding compound 300 and then performing a planarization process to remove extra dielectric material outside the one or more recesses A1 and the one or more pits A2. However, since the embodiments of the invention provide shallower recesses and/or pits, the formation of the dielectric pre-layer may be omitted.

Figure 6A:
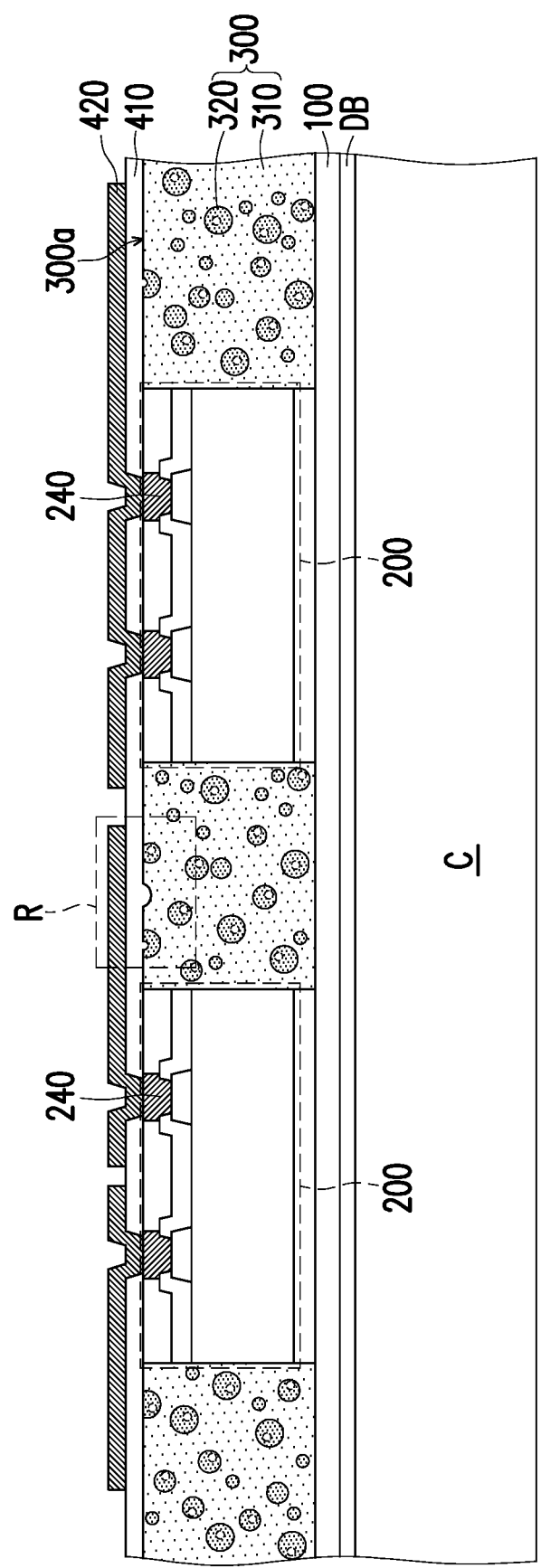
Figure 6B:
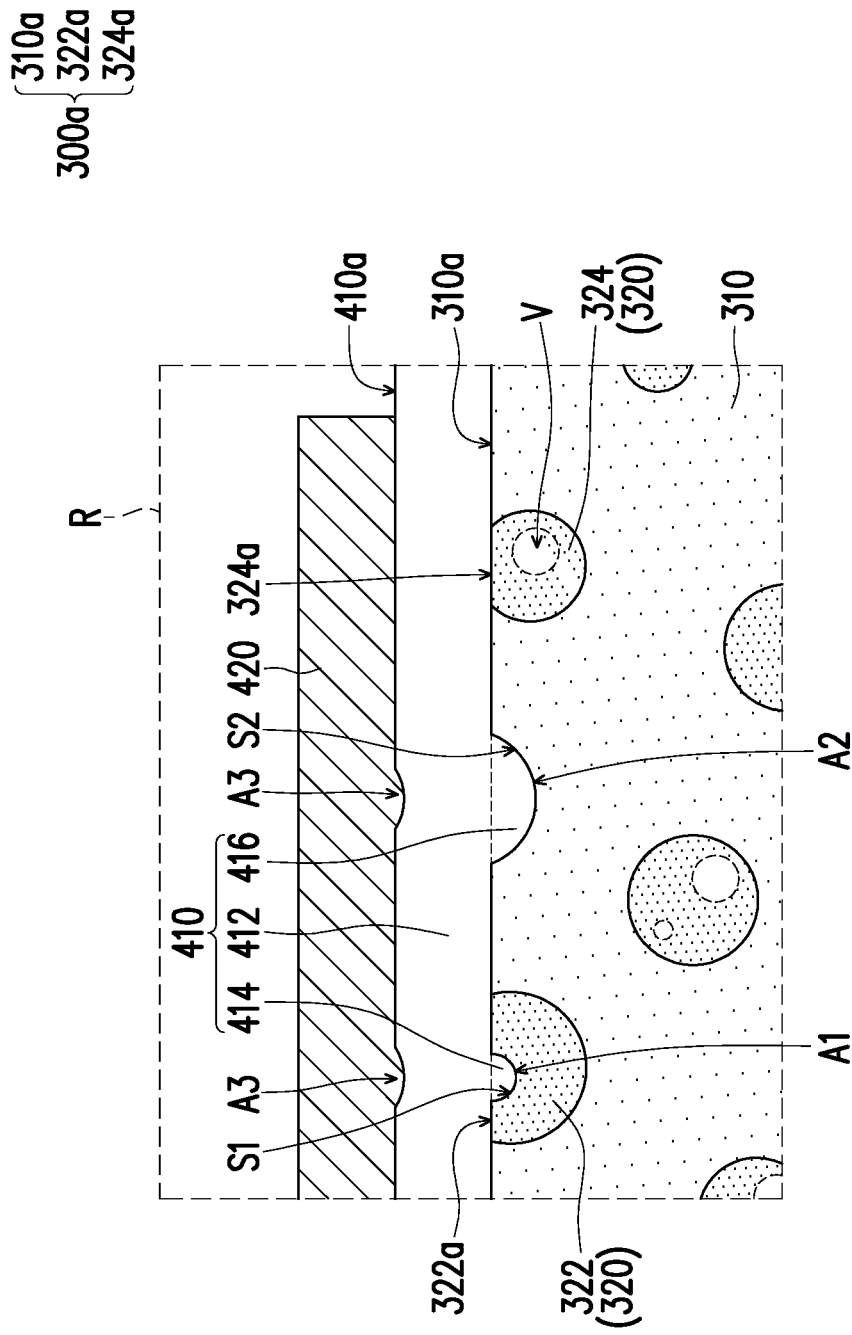

Referring to FIGS. 6A and 6B, in some embodiments, the redistribution layer 420 is formed on the polymer dielectric layer 410 and penetrates through the polymer dielectric layer 410 to be electrically connected to the conductive pillars 240 of the semiconductor dies 200. In some embodiments, the method of forming the redistribution layer 420 includes the following steps. First, a seed layer (not shown) is formed on the top surface of the polymer dielectric layer 410 and extending into the via openings O of the polymer dielectric layer 420. The seed layer may be formed by a physical vapor deposition process or the like, and the seed layer may be a metal seed layer such as a copper seed layer, or a composite layer such as a titanium layer and a copper layer over the titanium layer. Then, a patterned photoresist layer (not shown) having a plurality of openings exposing portions of the seed layer is formed over the seed layer. Then, a plating process is performed to form the redistribution layer 420 on the seed layer within the openings of the patterned photoresist layer. Thereafter, the patterned photoresist layer is removed and the seed layer not covered by the redistribution layer 420 is removed (e.g., by an etching process). As shown in FIG. 6B, in some embodiments, the redistribution layer 420 is formed to have a planar top surface without recesses.

Figure 7:
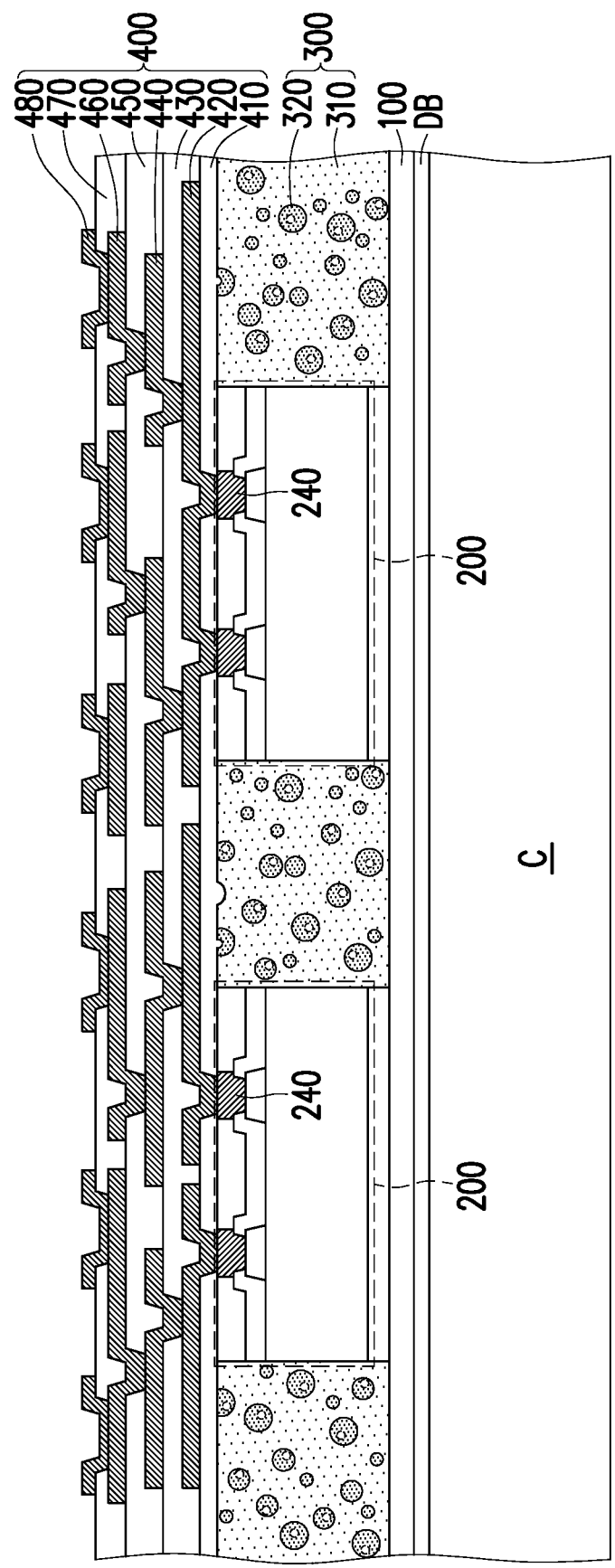

Referring to FIG. 7, in some embodiments, the polymer dielectric layer 430 is formed on the polymer dielectric layer 410 and the redistribution layer 420. The redistribution layer 440 is formed on the polymer dielectric layer 430 and penetrates through the polymer dielectric layer 430 to be electrically connected to the redistribution layer 420. The polymer dielectric layer 450 is formed on the polymer dielectric layer 430 and the redistribution layer 440. The redistribution layer 460 is formed on the polymer dielectric layer 450 and penetrates through the polymer dielectric layer 450 to be electrically connected to the redistribution layer 440. The polymer dielectric layer 470 is formed on the polymer dielectric layer 450 and the redistribution layer 460. The redistribution layer 480 is formed on the polymer dielectric layer 470 and penetrates through the polymer dielectric layer 470 to be electrically connected to the redistribution layer 460. In some embodiments, the polymer dielectric layers 430, 450 and 470 and the redistribution layers 440, 460 and 480 may be formed using similar methods as the polymer dielectric layer 410 and the redistribution layer 420 described above, and the detailed description is thus omitted herein. In some embodiments, the topmost redistribution layer 480 is also referred as under-ball metallurgy (UBM) layer for ball mounting.

In some embodiments, the material of the polymer dielectric layers 410, 430, 450 and 470 may include polyimide, benzocyclobutene (BCB), polybenzoxazole (PBO), or any other suitable polymer-based dielectric material. In some embodiments, the material of the redistribution layers 420, 440, 460 and 480 may include aluminum, titanium, copper, nickel, tungsten, and/or alloys thereof.

Figure 8:
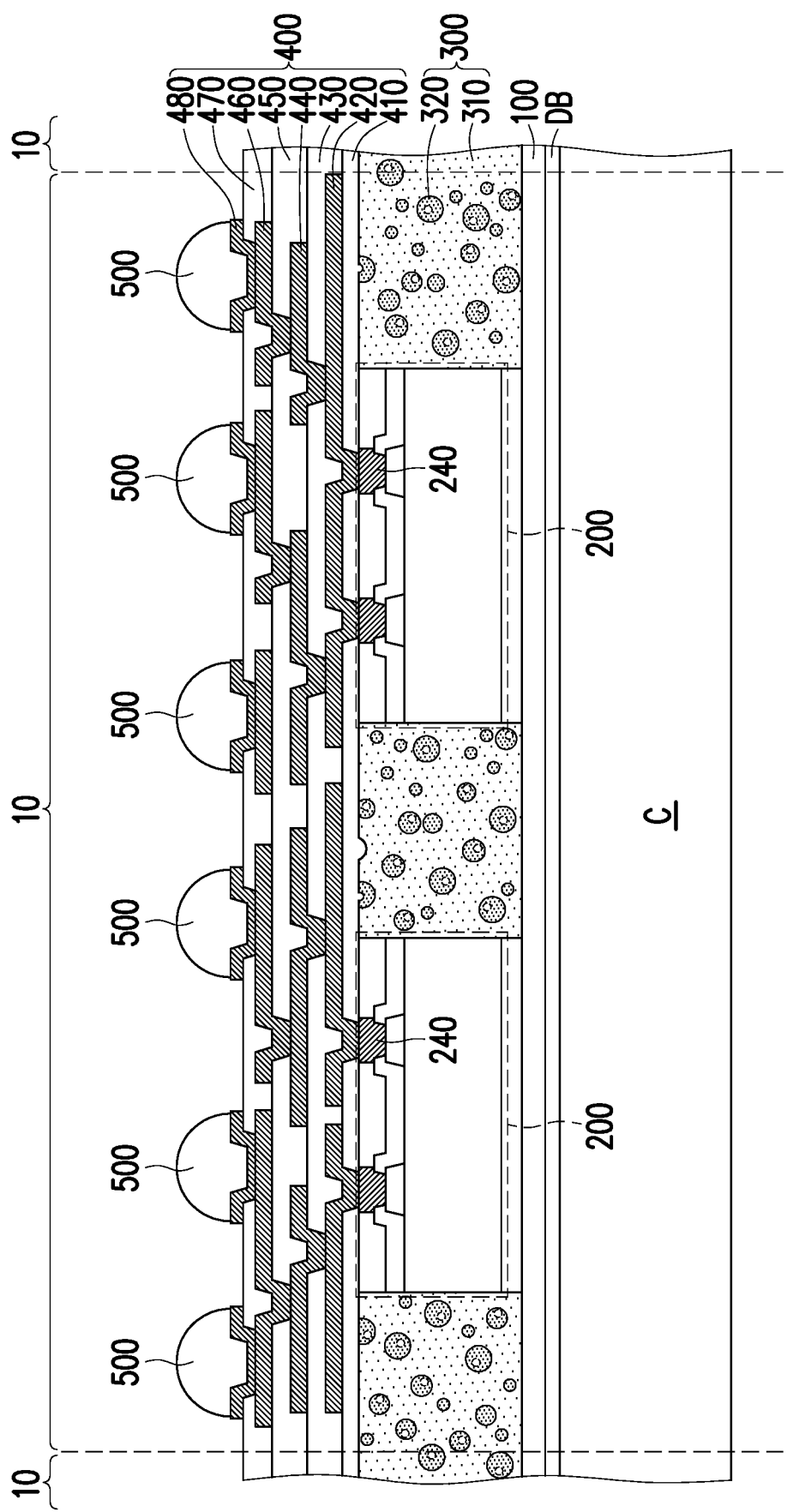

Referring to FIG. 8, in some embodiments, a plurality of conductive connectors 500 disposed on the topmost redistribution layer 480 are formed. In some embodiments, prior to disposing the conductive connectors 500, solder paste or flux (not shown) is applied so that the conductive connectors 500 are better fixed to the topmost redistribution layer 480. In some embodiments, the conductive connector 500 includes a conductive bump, a solder ball or ball grid array (BGA) balls. In some embodiments, the conductive connectors 500 may be placed on the redistribution layer 480 through a ball placement process. In some embodiments, the redistribution layer 480 may be optional. In some embodiments, the configurations of the redistribution layer 480 and the conductive connectors 500 may be determined based on circuit design. Then, a singulation process may be performed to individualize the packages 10. In one embodiment, the singulation process is a wafer dicing process including mechanical sawing or laser cutting.

Figure 9:
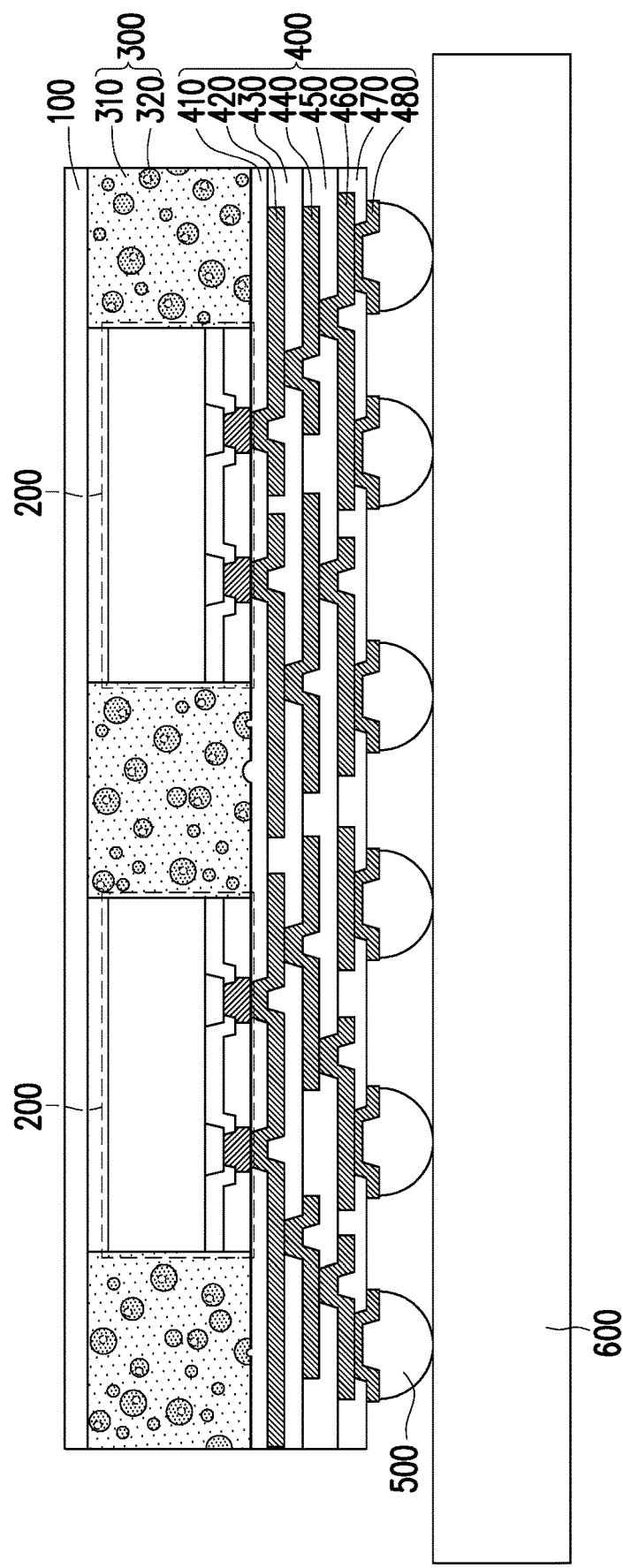

Referring to FIG. 9, in some embodiments, after the singulation process, the semiconductor package 10 is flipped. Then, the carrier C is debonded and removed from the buffer layer 100. In some embodiments, the buffer layer 100 is easily separated from the carrier C due to a debond layer DB therebetween. In some embodiments, the carrier C is detached from the buffer layer 100 through a debonding process, where the carrier C and the debond layer DB are removed, and the buffer layer 100 is exposed. In one embodiment, the debonding process is a laser debonding process. In some alternative embodiments, the carrier C is removed through a dry etching process or a wet etching process, and the buffer layer 100 may serve as an etching stop layer. In some embodiments, the buffer layer 100 may be remained on the molding compound 300 and the semiconductor dies 200 to serve as a protection layer. Alternatively, in some embodiments, the buffer layer 100 may be subsequently removed. In some embodiments, the semiconductor package 10 may be further mounted to a circuit substrate 600 (such as a printed circuit board (PCB)) by connecting the conductive connectors 500 to the circuit substrate 600. In some alternative embodiments, the semiconductor package 10 may be mounted onto another package or sub-package unit.

According to some embodiments, a semiconductor package includes a semiconductor die, a molding compound and a redistribution structure. The molding compound laterally wraps around the semiconductor die, wherein the molding compound includes a base material and a first filler particle and a second filler particle embedded in the base material. The first filler particle has a first recess located in a top surface of the first filler particle, and the second filler particle has at least one hollow void therein. The redistribution structure is disposed on the semiconductor die and the molding compound, wherein the redistribution structure has a polymer dielectric layer. The polymer dielectric layer includes a body portion and a first protruding portion protruding from the body portion, wherein the body portion is in contact with the base material and the top surface of the first filler particle, and the first protruding portion fits with the first recess of the first filler particle.

According to some embodiments, a semiconductor package includes a semiconductor die, a molding compound and a redistribution structure. The molding compound laterally wraps around the semiconductor die, wherein the molding compound includes a base material having one or more pits located in a top surface of the base material and a first filler particle and a second filler particle embedded in the base material. The first filler particle has a first recess located in a top surface of the first filler particle. The second filler particle has at least one inner surface enclosed within the second filler particle. The redistribution structure is disposed on the semiconductor die and the molding compound, wherein the redistribution structure has a polymer dielectric layer, the polymer dielectric layer includes a body portion as well as a first protruding portion and one or more second protruding portions protruding from the body portion. The body portion is in contact with the base material and the top surface of the first filler particle. The first protruding portion fits with the first recess of the first filler particle. The one or more second protruding portions fit with the one or more pits of the base material.

According to some embodiments, a method of forming a semiconductor package includes the following steps. A semiconductor die having an active surface and including a plurality of conductive pillars on the active surface is provided. A molding compound encapsulating and wrapping around the semiconductor die is formed. The molding compound includes a base material and filler particles distributed in the base material, wherein some of the filler particles each have at least one hollow void therein. A planarization process is performed on the molding compound to expose the plurality of conductive pillars of the semiconductor die, so that the filler particles in the base material are removed partially to form a first filler particle and a second filler particle, wherein one of the at least one hollow void of the first filler particle is opened to form a first recess, and the at least one hollow void of the second filler particle is not opened. A polymer dielectric layer is formed over the semiconductor die and the planarized molding compound, such that a body portion of the polymer dielectric layer is formed to cover a top surface of the planarized base material and top surfaces of the first filler particle and the second filler particle, and a first protruding portion of the polymer dielectric layer protruding from the body portion is formed to fill the first recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package, comprising:
a semiconductor die;
a molding compound laterally wrapping around the semiconductor die, wherein the molding compound includes a base material, a first filler particle and a second filler particle, the first and second filler particles are embed- ded in the base material, the first filler particle has a first recess located in a top surface of the first filler particle, and the second filler particle has at least one hollow void therein; and a redistribution structure disposed on the semiconductor die and the molding compound, wherein the redistribution structure has a polymer dielectric layer, the polymer dielectric layer includes a body portion and a first protruding portion protruding from the body portion, wherein the body portion is in contact with the base material and the top surface of the first filler particle, and the first protruding portion fits with the first recess of the first filler particle.

2. The semiconductor package of claim 1, wherein the top surface of the first filler particle and a top surface of the second filler particle are substantially at a same level with a top surface of the base material.

3. The semiconductor package of claim 1, wherein the first filler particle has at least one hollow void therein.

4. The semiconductor package of claim 1, wherein the base material has one or more pits located in a top surface of the base material.

5. The semiconductor package of claim 4, wherein the polymer dielectric layer further includes one or more second protruding portions protruding from the body portion, wherein the one or more second protruding portions fit with the one or more pits of the base material.

6. The semiconductor package of claim 1, wherein the molding compound further includes a third filler particle embedded in the base material, the third filler particle has two or more second recesses located in a top surface of the third filler particle.

7. The semiconductor package of claim 6, wherein the polymer dielectric layer further includes two or more third protruding portions protruding from the body portion, wherein the two or more third protruding portions fit with the two or more second recesses of the third filler particle.

8. The semiconductor package of claim 1, wherein the molding compound further includes a fourth filler particle distributed in the base material, the fourth filler particle is sphere-shaped or globular and has at least one hollow void therein, and an average ratio of a volume of the at least one hollow void to a volume of the fourth filler particle thereof is equal to or less than about 30% by volume.

9. The semiconductor package of claim 1, wherein a Young's modulus of the molding compound is equal to or larger than 15 GPa.

10. A semiconductor package, comprising:
a semiconductor die;
a molding compound laterally wrapping around the semiconductor die, wherein the molding compound includes a base material having one or more pits located in a top surface of the base material and a first filler particle and a second filler particle embedded in the base material, the first filler particle has a first recess located in a top surface of the first filler particle, and the second filler particle has at least one inner surface enclosed within the second filler particle; and
a redistribution structure disposed on the semiconductor die and the molding compound, wherein the redistribution structure has a polymer dielectric layer, the polymer dielectric layer includes a body portion as well as a first protruding portion and one or more second protruding portions protruding from the body portion, wherein the body portion is in contact with the base material and the top surface of the first filler particle, the first protruding portion fits with the first recess of the first filler particle, and the one or more second protruding portions fit with the one or more pits of the base material.

11. The semiconductor package of claim 10, wherein the top surface of the first filler particle and a top surface of the second filler particle are substantially coplanar with a top surface of the base material.

12. The semiconductor package of claim 10, wherein the first filler particle has at least one inner surface enclosed within the first filler particle.

13. The semiconductor package of claim 10, wherein the molding compound further includes a third filler particle embedded in the base material, and the third filler particle has two or more second recesses located in a top surface of the third filler particle.

14. The semiconductor package of claim 13, wherein the polymer dielectric layer further includes two or more third protruding portions protruding from the body portion, and outer contours of the two or more third protruding portions match the two or more second recesses of the third filler particle.

15. The semiconductor package of claim 10, wherein a Young's modulus of the molding compound is equal to or larger than 15 GPa.

16. A method of forming a semiconductor package, comprising:
providing a semiconductor die having an active surface and comprising a plurality of conductive pillars on the active surface;
forming a molding compound encapsulating and wrapping around the semiconductor die, the molding compound comprising a base material and filler particles distributed in the base material, wherein some of the filler particles are hollow particles each having at least one hollow void therein;
performing a planarization process on the molding compound to polish some of the hollow particles and expose the plurality of conductive pillars of the semiconductor die, wherein during the planarization process, at least one of the hollow particles is polished into a first filler particle with at least one first recess by opening the at least one hollow void therein, and at least one of the hollow particles distributed in the base material is unpolished and is a second filler particles; and
forming a polymer dielectric layer over the semiconductor die and the planarized molding compound, such that a body portion of the polymer dielectric layer is formed to cover a top surface of the planarized base material and top surfaces of the first filler particle and the second filler particle, and a first protruding portion of the polymer dielectric layer protruding from the body portion is formed to fill the at least one first recess.

17. The method of claim 16, wherein during the planarization process, one or more of the filler particles are entirely removed from the base material, so as to form one or more pits in the planarized base material.

18. The method of claim 17, wherein forming the polymer dielectric layer further comprises forming one or more second protruding portions protruding from the body portion to fill the one or more pits.

19. The method of claim 16, wherein at least one of the hollow particles of the filler particles in the base material is polished into a third filler particle with two or more recesses by opening the hollow voids therein.

20. The method of claim 16, wherein the molding compound is formed from a molding material containing a hardening agent with amine groups.

* * * * *